(12) United States Patent
Esch

(10) Patent No.: US 7,834,695 B2
(45) Date of Patent: Nov. 16, 2010

(54) DIFFERENTIAL INPUT AMPLIFIER

(75) Inventor: Hélène Esch, Seyssinet-Pariset (FR)

(73) Assignee: STMicroelectronics SAS, Grenoble (FR)

( * ) Notice: Subject to any disclaimer, the term of this patent is extended or adjusted under 35 U.S.C. 154(b) by 93 days.

(21) Appl. No.: 12/369,554

(22) Filed: Feb. 11, 2009

(65) Prior Publication Data

US 2009/0201087 A1  Aug. 13, 2009

(30) Foreign Application Priority Data

Feb. 11, 2008  (FR) ................................. 08 50835

(51) Int. Cl.
*H03F 3/45* (2006.01)
(52) U.S. Cl. ...................... 330/257; 330/261
(58) Field of Classification Search ................. 330/257, 330/261, 252
See application file for complete search history.

(56) References Cited

U.S. PATENT DOCUMENTS

| 3,894,290 A | 7/1975 | Schoeff | |
| 5,291,149 A * | 3/1994 | Nunoshima | 330/255 |
| 5,483,151 A * | 1/1996 | Yamashita | 323/312 |
| 6,078,168 A * | 6/2000 | Paolo | 323/226 |
| 2001/0015674 A1 | 8/2001 | Kudo et al. | |

FOREIGN PATENT DOCUMENTS

EP  0072082 A  2/1983

* cited by examiner

*Primary Examiner*—Henry K Choe
(74) *Attorney, Agent, or Firm*—Lisa K. Jorgenson; Robert Iannucci; Seed IP Law Group PLLC

(57) ABSTRACT

An amplifier comprises: first and second supply terminals intended to receive a DC supply voltage; a first branch coupled between the first and second supply terminals and including a first terminal of application of a differential signal to be amplified; a second branch coupled between the first and second supply terminals and including a second terminal of application of the differential signal to be amplified; a third branch coupled between the first and second supply terminals and including a first amplifier having an input terminal connected to the second branch and having an output terminal configured to be coupled to a load, and a measurement element configured to measure a current in the third branch; and a fourth branch coupled between the first and second supply terminals and including a second amplifier having an input terminal connected to the first branch, and a copying element configured to copy the current measured in the third branch.

18 Claims, 4 Drawing Sheets

DIFFERENTIAL INPUT AMPLIFIER

BACKGROUND

1. Technical Field

The present disclosure generally relates to electronic circuits and, more specifically, to differential input amplifiers. The present disclosure more specifically applies to amplifiers made in bipolar or BiCMOS technology.

2. Description of the Related Art

Amplifiers with a differential input pair are, especially for small signals (on the order of a few tens of millivolts at the input), particularly sensitive to imbalances (offsets) likely to be present in the currents between branches.

One can distinguish so-called random imbalance linked to a mismatch between the components from a so-called systematic imbalance, linked to the amplifier structure (diagram). A random imbalance varies from one chip to the other in circuits of a same wafer while a systematic imbalance is the same for all chips in a same wafer but is sensitive to manufacturing dispersions (variations from one wafer or from one wafer batch to another) as well as to the circuit operating temperature.

The systematic imbalance is due to the sampling, from a single one of the two differential branches, of a current to be amplified to provide the useful signal. This introduces an imbalance in the currents of the two branches, which alters the input signal measurement, and thus the accuracy of the amplification.

The systematic imbalance has long been neglected with respect to the random imbalance. Advances in the correction of random imbalances result in a no longer negligible systematic imbalance, in particular for low-amplitude input signals (with an amplitude lower than a few tens of millivolts).

BRIEF SUMMARY

One embodiment is a solution to correct possible systematic imbalances in an amplifier.

The solution can be transposed to different differential input pair amplifier structures.

One embodiment overcomes all or part of the disadvantages of amplifiers with differential inputs.

One embodiment decreases the systematic imbalance.

One embodiment is a solution self-adaptable to the circuit temperature operating conditions.

One embodiment is a solution compatible with different amplifier structures.

One embodiment is an amplifier with differential inputs comprising, between two terminals intended to receive a D.C. supply voltage:

a first branch comprising a first terminal of application of a differential signal to be amplified;

a second branch comprising a second terminal of application of the differential signal to be amplified;

a third branch comprising a first bipolar amplifier having an input terminal connected to the second branch and having an output terminal intended to be coupled to a load, and an element for measuring the current in this third branch; and a fourth branch comprising a second bipolar amplifier having an input terminal connected to the first branch, and an element for copying the current measured in the third branch.

According to an embodiment, the measurement and copying elements are respectively associated with resistors in series.

According to an embodiment, the amplifiers of the third and fourth branches are formed by means of identical transistors.

According to an embodiment, the measurement and copying elements are formed of identical transistors.

According to an embodiment, the measurement element comprises a first diode-assembled transistor and the copying element comprises a second transistor mirror-assembled on the first transistor.

According to an embodiment, the amplifier is formed in bipolar technology.

According to an embodiment, the amplifier is formed in BiCMOS technology.

One embodiment is a method for compensating for an imbalance between a first branch and a second branch of an amplifier with differential inputs, comprising the steps of:

measuring the value of a current induced by a load coupled to the second branch; and reproducing a current of same value in the first branch.

The foregoing features and advantages will be discussed in detail in the following non-limiting description of specific embodiments in connection with the accompanying drawings.

DETAILED DESCRIPTION

Figure 1:
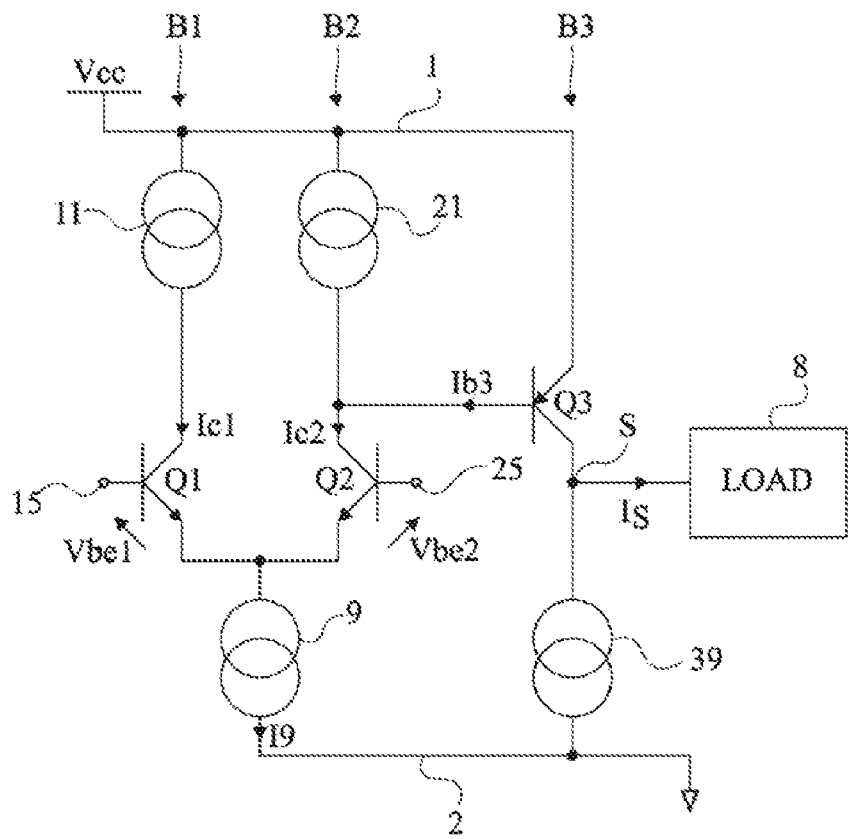
FIG. 1 is an electric diagram of an amplifier with no systematic imbalance correction.

For clarity, the same elements have been designated with the same reference numerals in the different drawings. Further, only those elements which are useful to the understanding of the present disclosure have been shown and will be described. In particular, the origin of the signals to be amplified and the destination of the amplified signals have not been detailed, the present disclosure being compatible with any current use.

In the following description, only the systematic imbalance is considered and the transistors are assumed to be matched, that is, with no random imbalance. The possible random imbalance may be addressed by other means.

FIG. 1 schematically shows an example of an amplifier with a differential input pair with no systematic imbalance correction. The differential pair comprises two parallel branches B1 and B2, each comprising a bipolar transistor Q1 or Q2 in series with a current source 11 or 21, respectively. The two branches B1 and B2 are in parallel between a terminal 1 of application of a first supply voltage (positive voltage Vcc in this example) and a bias current source 9, itself connected to a terminal 2 of application of a second supply voltage (for example, the ground). In this example, transistors Q1 and Q2 are of type NPN and their respective emitters are connected together to a terminal of current source 9 while their respective collectors are connected to current sources 11 and 21. The respective bases of transistors Q1 and Q2 define input terminals 15 and 25 of the amplifier. The collector of transistor Q2 is further connected to the base of a transistor Q3, for example, of type PNP, of a third branch B3 (amplification branch). The emitter of transistor Q3 is directly connected to terminal 1 while its collector is connected to terminal 2 by a bias source 39. This collector further defines an output terminal S intended to be connected to a load 8.

In an amplifier such as illustrated in FIG. 1, base current Ib3 of output transistor Q3 generates a systematic imbalance between branches B1 and B2. Current Ib3 makes the respective collector currents Ic1 and Ic2 of transistors Q1 and Q2 different, even though current sources 11 and 21 are sized to provide identical currents. Assuming that transistors Q1 and Q2 are perfectly matched (which amounts to neglecting the random imbalance), the voltage representative of the systematic imbalance, noted Vio, corresponds to the difference between the low/emitter voltages Vbe1 and Vbe2 of transistors Q1 and Q2. Assuming that the bias current 19 provided by bias source 9 corresponds to twice the current provided by each of sources 11 and 21, and assuming that base current Ib3 is very small as compared to this bias current, voltage Vio is approximately equal to $V_t(2*Ib3/I9)$, where Vt represents the thermodynamic voltage (kT/q, with T representing the temperature, q representing the charge of the electron and k representing Boltzmann's constant).

The systematic imbalance thus depends on operating temperature T of the circuit and on base current Ib3, and thus on current Is pulled by the load ($Is=\beta 3*Ib3$, where $\beta 3$ represents the gain of amplification transistor Q3).

Figure 2:
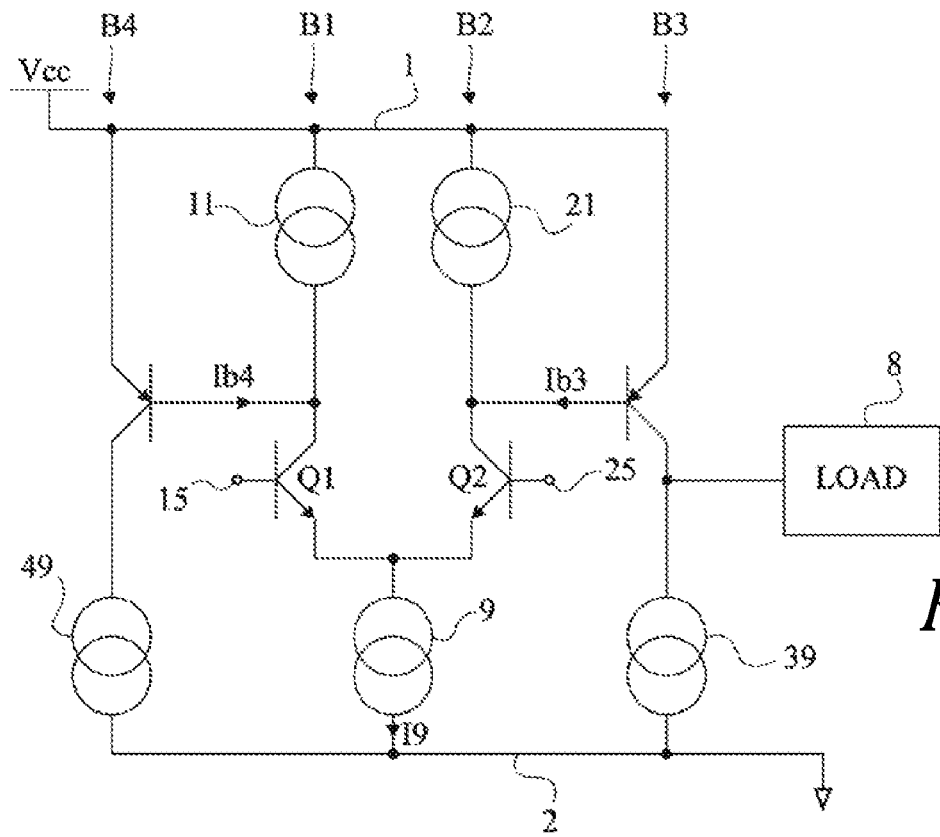
FIG. 2 is an electric diagram of an amplifier with a systematic imbalance correction.

FIG. 2 is an electric diagram of a usual solution for correcting the systematic imbalance in an amplifier such as shown in FIG. 1.

As compared with the diagram of FIG. 1, the circuit comprises a fourth branch B4, formed of a current source 49 and of a PNP-type bipolar transistor Q4. The base of transistor Q4 is connected to the collector of transistor Q1 while its emitter is connected to terminal 1 and its collector is connected by current source 49 to terminal 2. Such an assembly amounts to attempting to duplicate load 8 on branch B1 of the differential input pair. For this purpose, current source 49 is sized so that base current Ib4 of transistor Q4 corresponds to base current Ib3 of transistor Q3 in a nominal operation.

The systematic imbalance voltage in the assembly of FIG. 2 can, with the same assumptions as those discussed in relation with FIG. 1, be expressed as follows:

$$Vio=Vt(2(Ib4-Ib3)/I9).$$

This systematic imbalance thus disappears if base currents Ib4 and Ib3 are equal. In practice, the two currents are different from each other for several reasons. First, current Ib3 varies according to current Is surged by load 8 and the correction performed by the circuit of FIG. 2 does not enable taking such a variation into account. Further, an imbalance linked to the current mirror used to form sources 39 and 49 is likely to generate disparities between the two branches.

As a result, part of the systematic imbalance, which can be expressed as $Vt(\Delta Ib/I9)$, where $\Delta Ib$ represents the difference between currents Ib4 and Ib3, is not corrected.

This imbalance remains dependent on the temperature, on a variation of the load, or on a manufacturing process variation between amplifier batches originating from different wafers.

Figure 3:
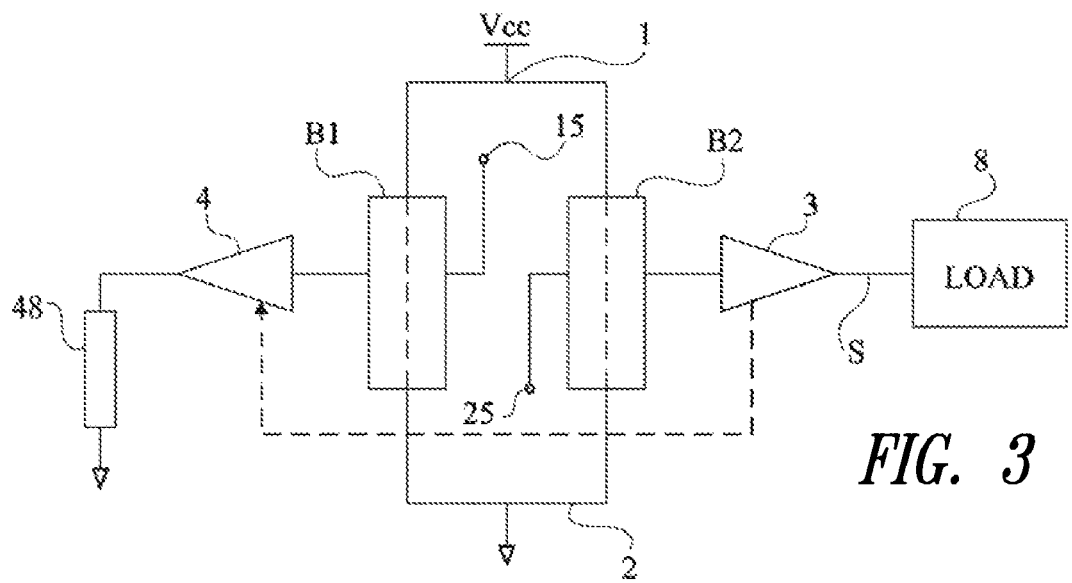
FIG. 3 is a block diagram of an embodiment of an amplifier with differential inputs.

FIG. 3 is a block diagram of an embodiment of an amplifier with differential inputs with a dynamic correction of the systematic imbalance.

The input stage (differential pair) is symbolized by two branches B1 and B2 in parallel between two terminals 1 and 2 of application of a D.C. supply voltage Vcc, branches B1 and B2 having input terminals 15 and 25 of application of a differential signal to be amplified. The output of branch B2 controls an amplifier in bipolar technology 3 having its output S intended to be connected to a load 8 (LOAD) to be powered. On the side of branch B1, an amplifier 4 in bipolar technology, identical to amplifier 3, is connected to a corresponding output of branch B1 and powers a load 48, which may be a dummy load. To dynamically correct the systematic imbalance, the current in output amplifier 3 is measured to be copied on the side of amplifier 4, to have it vary correspondingly. Thus, if the current in the load varies, this variation is reflected on the side of balancing amplifier 4. This operation will be better understood from the description of the following drawings.

Figure 4:
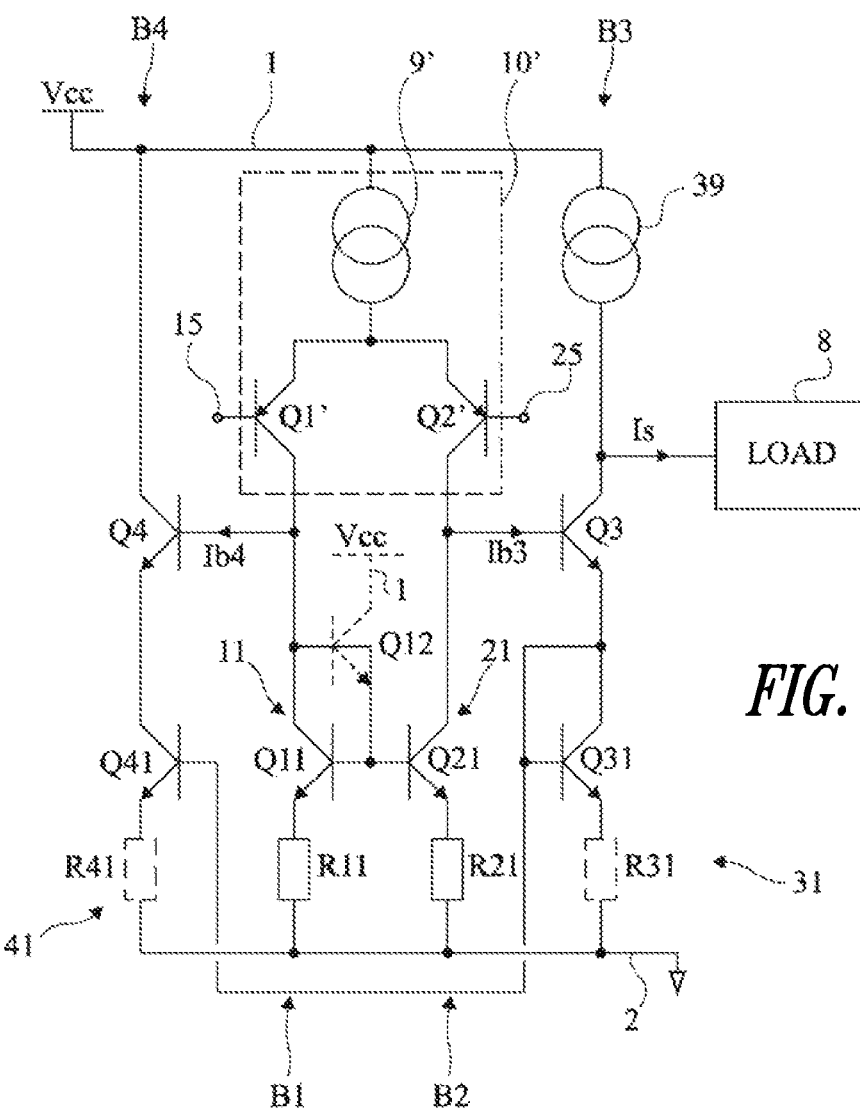
FIG. 4 is an electric diagram of an embodiment of an amplifier with differential inputs.

FIG. 4 is an electric diagram of an embodiment of an amplifier with a differential pair at its input, in which differential pair 10' is on the side of positive voltage Vcc, that is, current sources 11 and 21 of respective branches B1 and B2 are connected to terminal 2 (for example, the ground) and bias source 9' is connected to terminal 1.

In this example, transistors Q1' and Q2' of branches B1 and B2 are of type PNP. Current sources 11 and 21 are formed of NPN-type transistors Q11 and Q21. Each transistor Q11, Q21 has its emitter connected to terminal 2 by a resistor R11, R21, respectively, with transistor Q21 being mirror-assembled on transistor Q11 which is assembled as a diode (collector and base interconnected). Resistors R11 and R21 ideally have the same value but are in practice adjusted to balance branches B1 and B2 in the quiescent state. As a variation, an additional transistor Q12 (shown in dotted lines), called a booster, is used to decrease the impact of the base currents of transistors Q11 and Q21 on the current in transistor Q11. The base of transistor Q12 is connected to the collector of transistor Q11 while its emitter is connected to the common bases of transistors Q11 and Q21 and its collector is connected to terminal 1 or to any other fixed voltage node.

On the amplification branch side, an NPN-type transistor Q31 is interposed between the emitter of transistor Q3 and terminal 2. Transistor Q31 is diode-assembled (collector and base interconnected) and is used to measure the emitter current of transistor Q3, and thus indirectly its collector current, which varies according to current Is pulled by load 8. A bias current source 39 remains interposed between terminal 1 and the collector of transistor Q3 from which output current Is is sampled.

A fourth branch B4 is used to reproduce the imbalance on branch B1. Branch B4 comprises, in series between terminals 1 and 2, an NPN-type transistor Q4 and a current source 41, formed of an NPN-type transistor Q41. Transistor Q41 has its emitter connected to terminal 2 and its collector connected to the emitter of transistor Q4. Transistor Q41 is mirror-assembled on measurement transistor Q31, its base being connected to that of transistor Q31. The function of transistor Q41 is to reproduce, on the side of transistor Q4, a variation of the current in transistor Q3. The fact of making the current in transistor Q4 dependent on that in transistor Q3 enables compensating, both in temperature and in charge current variation, and also in manufacturing process variation, the respective currents of the differential branches and, accordingly, considerably decreasing the systematic imbalance of the amplifier. This amounts to canceling (making negligible) difference ΔIb between base currents Ib4 and Ib3.

Resistors R31 and R41 (shown in dotted lines) may be interposed between the respective emitters of transistors Q31 and Q41 of terminal 2. Such optional resistors improve the accuracy of the balancing of branches B3 and B4 (and thus B1 and B2), but at the cost of an additional voltage drop.

Figure 5:
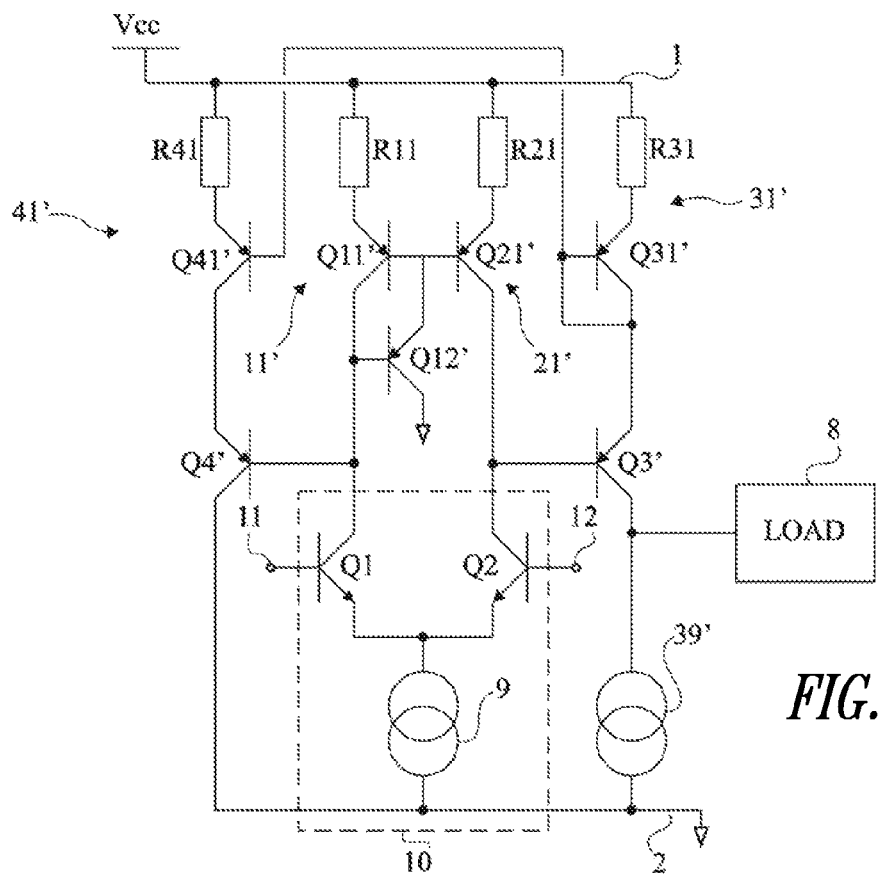
FIG. 5 is an electric diagram of another embodiment of an amplifier with differential inputs.

FIG. 5 shows the electric diagram of another embodiment of an amplifier in which differential pair 10 has an inverted position with respect to FIG. 4, with current source 9 being connected to terminal 2 and transistors Q1 and Q2 being of type NPN. As compared with the assembly with FIG. 4, PNP-type transistors Q11', Q21', Q31', and Q41 form current sources 11', 21', 31', and 41' on the side of terminal 1 and amplification and correction transistors Q3' and Q4' are of type PNP. In the example of FIG. 5, a booster PNP-type transistor Q12' has been illustrated. The operation of the assembly of FIG. 5 can be induced from that discussed in relation with the previous drawings.

According to an alternative embodiment, not shown, the role of transistor Q4 of FIG. 4 (respectively Q4' of FIG. 5) is played by transistor Q12 (respectively Q12') which is then matched with transistor Q3 (respectively Q3'). The collector of transistor Q41 (respectively Q41') is connected to the emitter of transistor Q12 (respectively Q12'). This amounts to connecting the junction point of transistors Q4 and Q41 (respectively Q4' and Q41') to the bases of transistors Q11 and Q21 (respectively Q11' and Q21') without connecting these bases to the collector of transistor Q11 (respectively Q11').

Figure 6:
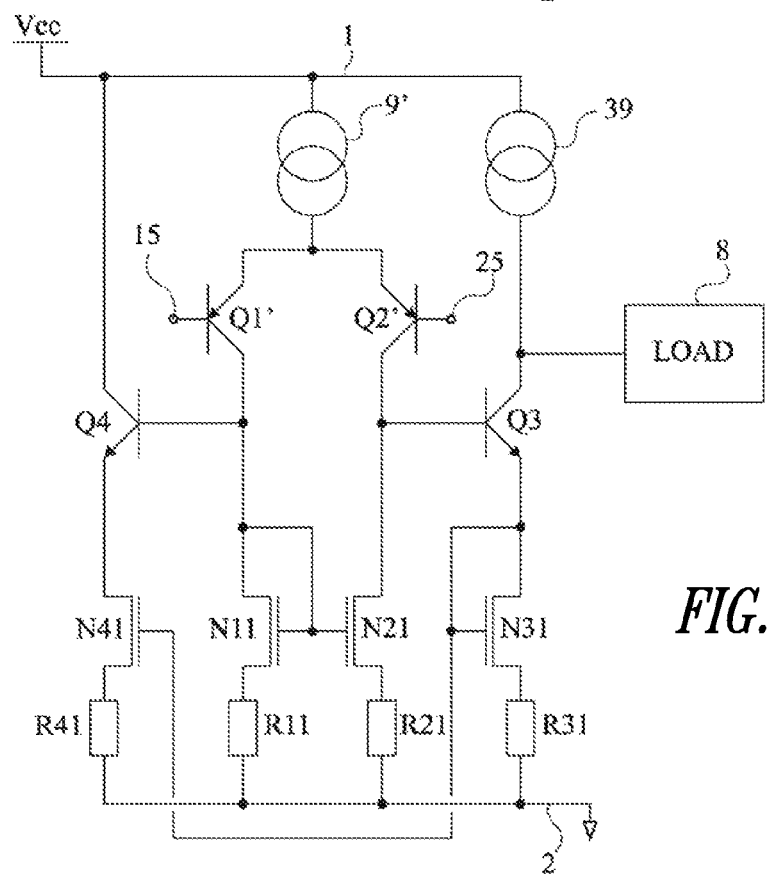
FIG. 6 is an electric diagram of yet another embodiment of an amplifier with differential inputs.

FIG. 6 shows still another embodiment of an amplifier illustrating the fact that the transistors of the current sources may be MOS transistors. As compared with the diagram of FIG. 4, N-channel MOS transistors N11, N21, N31, and N41 are arranged instead of transistors Q11, Q21, Q31, and Q41. Transistors N11 and N31 are diode-assembled (interconnected gate and drain), transistors N21 and N41 being mirror-assembled, respectively on transistors N11 and N31.

Figure 7:
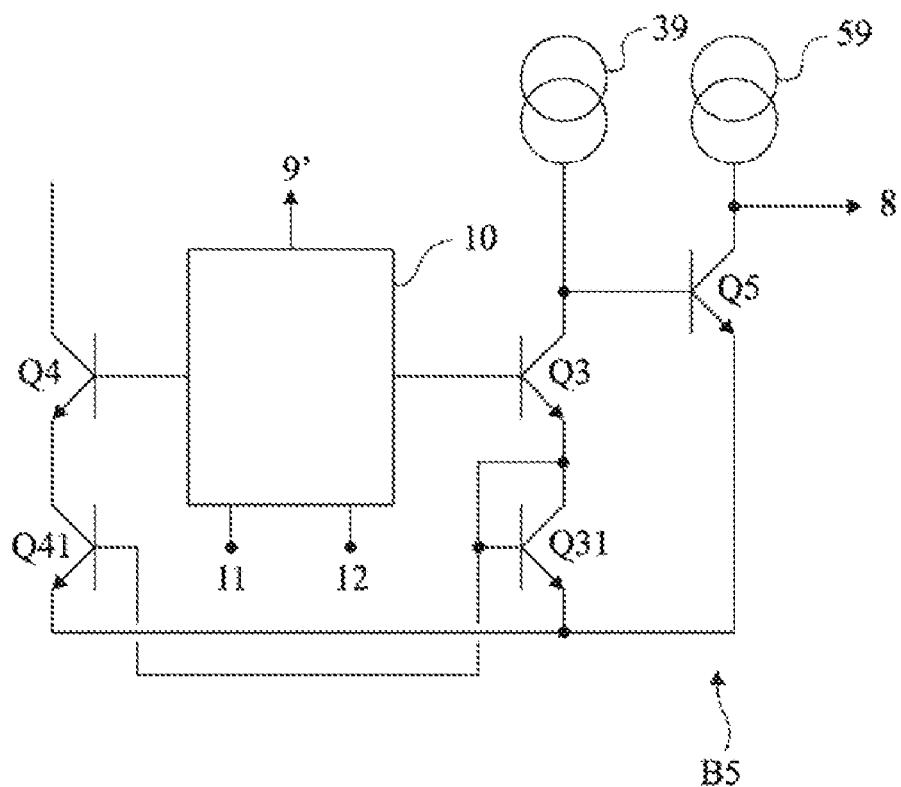
FIG. 7 partially illustrates an alternative output stage.

FIG. 7 partially shows a variation in which load 8 is not directly connected to the collector of transistor Q3 but via an additional branch B5 comprising an NPN-type transistor Q5 having its base connected to the collector of transistor Q3, the emitter is connected to terminal 2, and the collector is connected to terminal 1 by a bias current source 59. The collector of transistor Q5 defines the output terminal intended to be connected to load 8. This assembly illustrates that it is not necessary to reproduce the balancing system on a possible second amplification branch. Indeed, the errors generated by this branch may be neglected since they are of the second order due to the amplification already performed by transistor Q3, the current sampled from its collector being a base current for transistor Q5.

Figure 8:
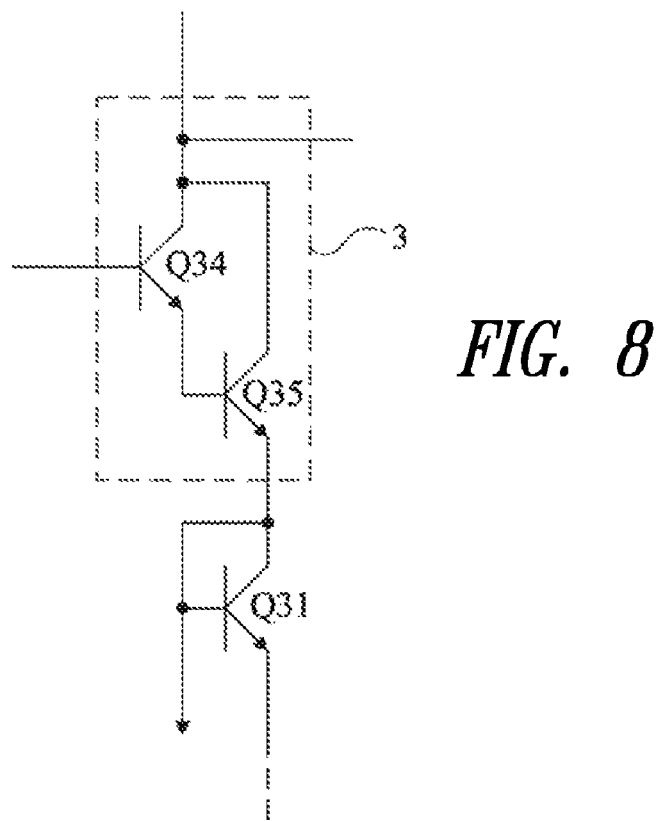
FIG. 8 partially illustrates another alternative output stage.

FIG. 8 illustrates another variation according to which transistor Q3 is replaced by a Darlington-type amplifier assembly 3 (transistors Q34 and Q35). In such a situation, the current of the full amplification branch must be measured (transistor Q31), that is, the measurement must be performed on the emitter of transistor Q35 rather than on that of transistor Q34. Other amplifying assemblies may be envisaged.

Amplifiers 3 and 4 are selected to be identical, which means that in case of a Darlington-type assembly or other, a similar assembly must be reproduced on the side of amplifier 4.

An advantage of the described embodiments is that they compensate for the systematic imbalance of an amplifier with differential inputs by making this compensation stable with respect to temperature and to manufacturing process variations.

Various embodiments have been described, and different variations and modifications may be envisaged and will occur to those skilled in the art. In particular, the choice between an exclusively bipolar or bipolar and MOS (BiCMOS) assembly depends on the other circuit assemblies and on the available technology, and it is possible to only have amplifiers 3 and 4 in bipolar technology, with the other components being bipolar or MOS. Further, the dimensions to be given to the different transistors and current sources depend on the application and are within the abilities of those skilled in the art based on the functional indications given hereabove. In practice, the transistors of the differential pair have the same surface, the same applying for the transistors of current sources 11 and 21. Further, the different discussed variations may be combined.

Such alterations, modifications, and improvements are intended to be part of this disclosure. Accordingly, the foregoing description is by way of example only and is not intended to be limiting.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An amplifier, comprising:
   first and second supply terminals intended to receive a DC supply voltage;
   a first branch coupled between the first and second supply terminals and including a first terminal of application of a differential signal to be amplified;
   a second branch coupled between the first and second supply terminals and including a second terminal of application of the differential signal to be amplified;
   a third branch coupled between the first and second supply terminals and including a first amplifier having an input terminal connected to the second branch and having an output terminal configured to be coupled to a load, and a measurement element configured to measure a current in the third branch; and
   a fourth branch coupled between the first and second supply terminals and including a second amplifier having an input terminal connected to the first branch, and a copying element configured to copy the current measured in the third branch.

2. The amplifier of claim 1, wherein the measurement element is coupled in series to a first resistor and the copying element is coupled in series to a second resistor.

3. The amplifier of claim 1, wherein the amplifiers of the third and fourth branches include identical transistors.

4. The amplifier of claim 1, wherein the measurement and copying elements include identical transistors.

5. The amplifier of claim 4, wherein the measurement element comprises a diode-assembled first transistor and the copying element comprises a second transistor mirror-assembled on the first transistor.

6. The amplifier of claim 1, formed in bipolar technology.

7. The amplifier of claim 1, formed in BiCMOS technology.

8. A method, comprising:
   compensating for an imbalance between a first branch and a second branch of an amplifier with differential inputs, the compensating includes:
   measuring a value of a load current induced by a load coupled to the second branch; and producing a reproduced current of the same value as the load current in the first branch.

9. The method of claim 8 wherein producing the reproduced current comprises producing the reproduced current via a current mirror.

10. An amplifier, comprising:
a first branch having a first input terminal to receive a differential signal;
a second branch having a second input terminal to receive the differential signal;
means for measuring a value of a load current induced by a load coupled to the second branch; and
means for producing a reproduced current of the same value as the load current in the first branch.

11. The amplifier of claim 10 wherein the means for measuring the value of the load current comprises a third branch, the third branch including an amplifier having an input terminal coupled to the second branch, an output terminal coupled to the load, and a measurement element to measure the load current in the third branch.

12. The amplifier of claim 10 wherein the means for producing the reproduced current comprises a fourth branch, the fourth branch including an amplifier having an input terminal coupled to the first branch and a copying element to produce the reproduced current in the fourth branch.

13. The amplifier of claim 11 wherein the measurement element comprises a diode-connected bipolar transistor, and wherein the copying element comprises a bipolar transistor having a base terminal coupled to a base terminal of the diode-connected bipolar transistor of the measurement element.

14. The amplifier of claim 11 wherein the measurement element comprises a diode-connected MOS field-effect transistor, and wherein the copying element comprises a MOS field-effect transistor having a gate terminal coupled to a gate terminal of the diode-connected MOS field-effect transistor of the measurement element.

15. The amplifier of claim 11 wherein the third branch further includes a resistor coupled in series with the measurement element.

16. The amplifier of claim 12 wherein the fourth branch further includes a resistor coupled in series with the copying element.

17. The amplifier of claim 11 wherein the third branch includes a pair of bipolar transistors coupled in a Darlington-pair configuration and coupled to the input terminal and the output terminal.

18. The amplifier of claim 11 wherein the output terminal of the third branch is coupled to the load through a bipolar transistor with the output terminal coupled to a base terminal of the bipolar transistor and the load coupled to a collector terminal of the bipolar transistor.

* * * * *